United States Patent [19]
Ikegami et al.

[11] Patent Number: 5,918,354
[45] Date of Patent: Jul. 6, 1999

[54] METHOD OF MAKING A PIEZOELECTRIC ELEMENT

[75] Inventors: Yasumitsu Ikegami; Takuya Miyakawa, both of Suwa, Japan

[73] Assignee: Seiko Epson Corporation, Tokyo, Japan

[21] Appl. No.: 08/825,804

[22] Filed: Apr. 2, 1997

[30] Foreign Application Priority Data

| Apr. 2, 1996 | [JP] | Japan | 54736 |
| Jan. 14, 1997 | [JP] | Japan | 56378 |

[51] Int. Cl.⁶ ............................................. H01L 41/22
[52] U.S. Cl. .................. 29/25.35; 228/124.1; 228/180.1; 228/206; 228/220; 310/312; 310/340; 427/100; 427/255.1
[58] Field of Search .......................... 29/25.35; 310/312, 310/340; 427/100, 255.1, 255.5, 255.6; 228/124.1, 179.1, 180.1, 180.21, 180.22, 205–207, 218–220

[56] References Cited

U.S. PATENT DOCUMENTS

| 3,762,941 | 10/1973 | Hou | 117/93.1 |
| 4,012,307 | 3/1977 | Phillips | 204/192 |
| 4,430,547 | 2/1984 | Yoneda et al. | 219/121 |
| 4,705,593 | 11/1987 | Haigh et al. | 156/635 |
| 4,708,766 | 11/1987 | Hynecek | 156/643 |
| 4,749,440 | 6/1988 | Blackwood et al. | 156/646 |
| 4,857,382 | 8/1989 | Liu et al. | 428/156 |
| 4,921,157 | 5/1990 | Dishon et al. | 228/124 |
| 5,000,819 | 3/1991 | Pedder et al. | 156/643 |
| 5,045,166 | 9/1991 | Bobbio | 204/192 |
| 5,120,568 | 6/1992 | Schuurmans et al. | 427/37 |
| 5,126,164 | 6/1992 | Okazaki et al. | 427/39 |
| 5,147,520 | 9/1992 | Bobbio | 204/192 |
| 5,178,682 | 1/1993 | Tsukamoto | 118/722 |
| 5,201,995 | 4/1993 | Reisman et al. | 156/646 |

(List continued on next page.)

FOREIGN PATENT DOCUMENTS

| 371693 | 6/1990 | European Pat. Off. . |
| 59-158525 | 9/1984 | Japan . |
| 60-1861 | 1/1985 | Japan . |
| 61-89708 | 5/1985 | Japan . |
| 60-134617 | 7/1985 | Japan . |
| 61-127866 | 6/1986 | Japan . |
| 2-190489 | 7/1990 | Japan . |
| 2-281734 | 11/1990 | Japan . |
| 3-174972 | 7/1991 | Japan . |
| 3-219082 | 9/1991 | Japan . |
| 3-219082 | 10/1991 | Japan . |
| 3-236475 | 10/1991 | Japan . |
| 4-186619 | 7/1992 | Japan . |
| 6-190269 | 12/1992 | Japan . |
| 5-82478 | 4/1993 | Japan . |
| 5-129874 | 5/1993 | Japan . |
| 6-2149 | 1/1994 | Japan . |

*Primary Examiner*—Carl E. Hall
*Attorney, Agent, or Firm*—Stroock & Stroock & Lavan LLP

[57] ABSTRACT

A piezoelectric resonator is provided which is formed of an element piece. This element piece further includes a piezoelectric material and an electrode formed on the surface of the piezoelectric material. A plug for mounting the element piece and a case for housing said element piece in an air-tight manner are also provided. The surface of the element piece is coated with a resin film formed from an excited active species of an organic compound generated through a gas discharge in a predetermined discharge gas at approximately atmospheric pressure. A method of manufacturing a piezoelectric resonator is also provided, which comprises the steps of first mounting the element piece on the plug. Next, a gas discharge in a predetermined discharge gas is produced at approximately atmospheric pressure and an excited active species of an organic compound which is a liquid or a gas at room temperature is generated as a result of this gas discharge in a gas discharge region. Next, the surface of the element piece is exposed to the excited active species and a resin film covering the surface of the element piece is formed.

13 Claims, 11 Drawing Sheets

U.S. PATENT DOCUMENTS

| | | | |
|---|---|---|---|
| 5,225,659 | 7/1993 | Kusano et al. | 249/121 |
| 5,240,559 | 8/1993 | Ishida | 456/666 |
| 5,290,378 | 3/1994 | Kusano et al. | 156/272 |
| 5,292,370 | 3/1994 | Tsai et al. . | |
| 5,316,739 | 5/1994 | Yoshikawa et al. | 422/186 |
| 5,340,618 | 8/1994 | Tanisaki et al. | 427/488 |
| 5,368,685 | 11/1994 | Kumihashi et al. | 156/643 |
| 5,384,167 | 1/1995 | Nishiwaki et al. | 427/569 |
| 5,391,855 | 2/1995 | Tanisaki . | |
| 5,399,830 | 3/1995 | Maruyama . | |
| 5,407,121 | 4/1995 | Koopman et al. | 228/206 |
| 5,449,432 | 9/1995 | Hanawa . | |
| 5,499,754 | 3/1996 | Bobbio et al. | 228/42 |
| 5,597,438 | 1/1997 | Grewal et al. . | |

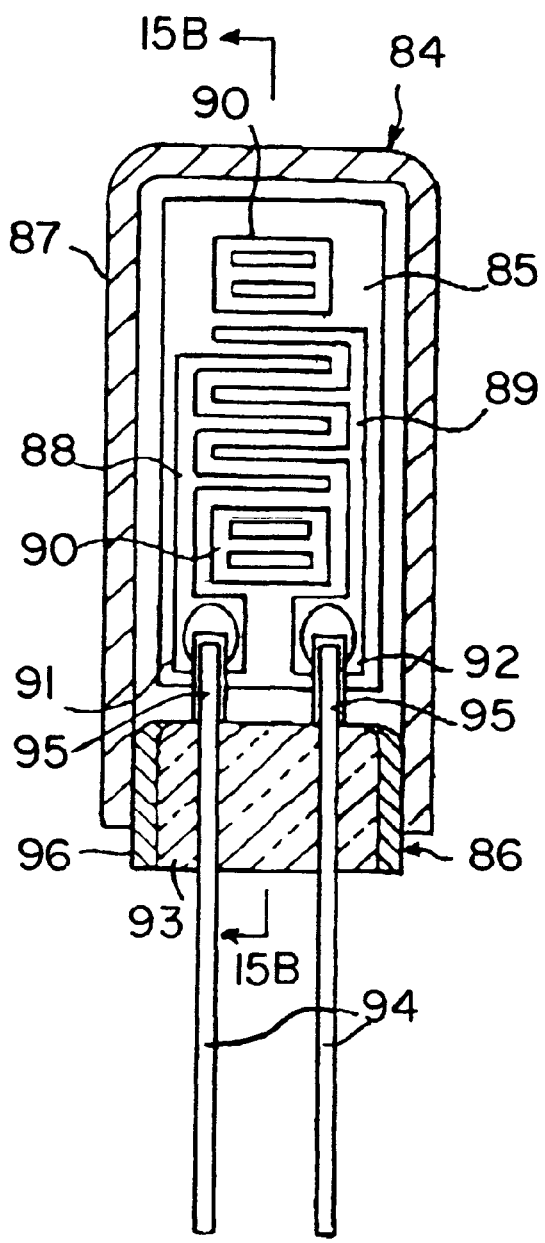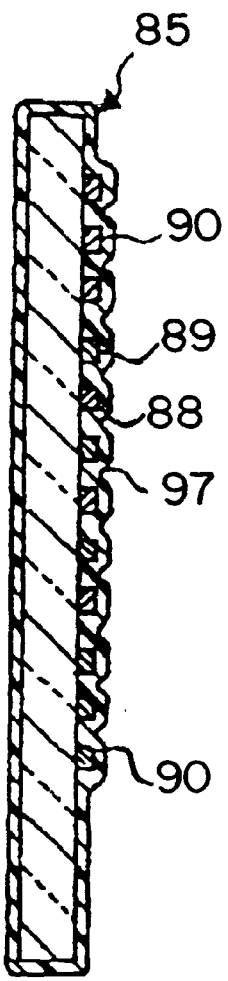

METHOD OF MAKING A PIEZOELECTRIC ELEMENT

BACKGROUND OF THE INVENTION

1. Field of the Invention

The invention relates generally to a piezoelectric element such as a piezoelectric resonator or a SAW (Surface Acoustic Wave) device such as a SAW resonator and a SAW filter constructed of a piezoelectric crystal such as quartz crystal or a piezoelectric ceramic material. More particularly, the invention relates to a piezoelectric element manufactured by utilizing an excited active species generated in plasma at approximately atmospheric pressure to perform surface treatment, and a method of manufacturing the same.

2. Description of the Related Art

A resonance type piezoelectric element which operates based upon the piezoelectric effect is conventionally well known in the art and may be used to function as a resonator, a filter or an oscillator. Piezoelectric elements include tuning fork type resonators using a frequency band ranging from about 20 kHz to 1 MHz, piezoelectric resonators such as AT-cut resonators using a frequency band within a range of from about 4 to 125 MHz, and SAW devices using a surface acoustic wave. In general, a piezoelectric resonator unit comprises a resonator, which in turn comprises a piezoelectric piece having an electrode formed on the surface thereof, and a plug having a lead for electrically connecting the electrode to an external electric circuit. The resonator is sealed in an air-tight manner in a case by a plug, which is a hermetic terminal.

A SAW device, which permits stable achievement of a high frequency within a range of from 100 MHz to the GHz band, may be used in a SAW resonator when constructing an oscillating circuit for a SAW filter to operate at high frequencies. In general, a SAW device has a SAW piece which further comprises a piezoelectric substrate such as a quartz plate. The quartz plate is further formed with a fine comb-shaped electrode on the surface thereof. The SAW piece is then usually bonded along its entire surface onto a support. This mechanism is then sealed in an air-tight manner in a case. Recently, the present inventors have developed a SAW device having a construction in which a SAW piece is cantilever-mounted on a plug comprising a hermetic terminal. This design is similar to that of the piezoelectric resonator unit. Then this improved SAW device is vacuum-sealed in a case.

During the construction of these piezoelectric elements, foreign matter may be mixed into the case before the piezoelectric resonator or SAW piece is sealed in the case in an air-tight manner. Also, it is possible that the surface coating of the plug or the case may peel off, producing dust. In the case of a tuning fork type piezoelectric resonator or a SAW device, dust may adhere to the piezoelectric piece surface, tending to cause a short circuit between adjacent electrodes. Thus, there is a risk that as a result, the oscillation of the resonator may stop, or the electrical impedance of the resonator may change. Particularly in view of the recent requirement for the downsizing and miniaturization of electronic parts, the gap between electrodes is becoming smaller, shrinking to about 20 to 30 $\mu$m, for example, to achieve a more compact piezoelectric element. Thus the tendency of short circuit between electrodes is increased.

Additionally, the electrodes may deteriorate under the effect of oxygen entering the case when the resonator is sealed within the case, or as a result of the adsorption of gases released from the plug or the case after being sealed. This deterioration may result in a shift of the oscillation frequency, or an increase in the CI (crystal impedance)-value. This may in turn cause deterioration of the operating properties of the piezoelectric element and may reduce the reliability of the piezoelectric element.

Piezoelectric elements comprising a piezoelectric piece with an electrode formed thereon and an insulating film formed on the surface of the piezoelectric piece have been developed in the prior art. For example, Japanese Examined Patent Publication No. 2-22564 discloses a SAW element in which a degradation in the operating properties which may be caused by short-circuiting of the electrodes is inhibited by coating the electrode portion formed on the piezoelectric substrate with a tantalum pentoxide insulating film, which is formed by sputtering vapor deposition. Japanese Patent Application No. 3-291660 laid open on May 25, 1993, which has been filed by the present inventors, discloses a construction in which a change in oscillation frequency or a deterioration in the operating properties, such as the CI-value, caused by adsorption of external gases or dust, is prevented by forming an insulating film comprising an oxide such as $SiO_2$ or fluoride on the surface of at least a flat electrode of a tuning fork type piezoelectric resonator. This film is formed by vacuum deposition, sputtering, or vacuum-plasma CVD. Japanese Unexamined Patent Publication No. 60-134617 discloses a piezoelectric resonator wherein deterioration of the resonator caused by oxidation or the like is prevented by applying a polyimide onto a metal layer, which has in turn been vapor-deposited on the surface of the piezoelectric resonator. Thus, an excitation electrode and an outgoing electrode are formed by patterning using the photolithography technique. This in turn causes the polyimide resin film to remain on these electrodes. A method of manufacturing this prior art piezoelectric resonator is also provided.

In conventional piezoelectric elements, when an insulating film formed on an electrode of the piezoelectric element is formed of a hard and rigid oxide such as $SiO_2$, the excessive thickness of the insulating film may hinder vibration of the piezoelectric element piece, thus reducing the CI-value and resulting in a decreased efficiency of operation. Thus, a reduced thickness insulating film having a thickness of about 1,000 Å is utilized to improve the efficiency of operation. However, use of this reduced thickness insulating film may result in insufficient electric insulation of the piezoelectric element. Furthermore, because of the high accuracy requirement of about ±200 Å in the film thickness, and the need to eliminate irregularities in the thickness of the film, it is difficult to control the film thickness to the required degree during the manufacturing process.

Particularly, in the case of a tuning fork type piezoelectric resonator unit, it is the conventional practice to adjust the frequency of the unit by removing the metal film overlayed on the electrode by the use of a laser beam. However, the laser beam cannot remove a conventional insulating film comprising an oxide such as $SiO_2$ since the laser is transmitted though this oxide film. Therefore, the conventional frequency adjusting technique of using a laser beam does not work when an oxide such as $SiO_2$ is used as the insulating film material. Therefore, it is necessary to form and remove portions of the insulating film by means other than by a laser beam. For example, a mask or the like may be used, thus resulting in a more complicated manufacturing operation.

When forming an insulating film on an electrode before mounting the piezoelectric element piece and electrode on the plug, the land for electrically connecting the piezoelectric electrode to the plug must be masked, leading to a complicated film forming operation. After being sealed in the case, metal portions such as the land and an inner lead terminal of the electrode which are exposed to the interior of the case without being covered with the insulating film may produce metal scrap, which may in turn cause a short circuit of the adjacent electrodes.

On the other hand, if the insulating film is formed on the piezoelectric element piece after mounting the element piece on the plug, the formed insulating film may cover a portion of the sealing portion of the plug. Thus, it would be impossible to seal the case in an air-tight manner. While it is therefore necessary to mask the plug upon forming the insulating film and to form the insulating film before mounting the element to the plug, it is difficult to conduct a complete masking during manufacture. Such a masking, if applied, would be of a large scale, resulting in a decreased efficiency of production.

A film formed by sputtering or vapor deposition requires expensive vacuum equipment during operation, hence requiring much time and cost for manufacturing. It is also difficult to conduct continuous processing of piezoelectric elements with these vacuum-type manufacturing processes of the piezoelectric element. It is thus impossible to automate the manufacturing process or to improve the productivity of manufacture. Furthermore, because the batch processing of a plurality of piezoelectric elements is usually effected under a vacuum or at a reduced-pressure condition, the operating frequency of the element piece cannot be measured while the insulating film is being formed. This leads to a serious difficulty in controlling the film thickness. Particularly when utilizing sputtering to form the film, the degree of film adhesion varies with the surface condition of the piezoelectric resonator and electrode to be formed. This may affect the operating frequency property of the piezoelectric element upon aging of the element. It is therefore necessary to carry out a sufficient pretreatment to insure proper film adhesion. However, it is still impossible to measure the operating frequency of the element piece while the insulating film is being formed.

Additionally, for the piezoelectric resonator disclosed in Japanese Unexamined Patent Publication No. 60-134617, formation of the insulating film and measurement of frequency cannot be accomplished simultaneously, since the manufacturing process is conducted in a batch manner. Another inconvenience is that the resin film is formed on the piezoelectric element before the element is mounted on the plug. It is therefore necessary to remove the resin film from the outgoing electrode surface upon connection of the element to the plug. As the connecting portion of the plug and plug surface cannot be coated prior to being connected, these portions exposed to the interior of the case may deteriorate by oxidation or may produce dust, which may in turn cause a short circuit between the outgoing electrodes. Therefore, it would be beneficial to provide a piezoelectric resonator, and a method of forming this resonator, which overcomes these drawbacks of the prior art.

SUMMARY OF THE INVENTION

Generally speaking, in accordance with the invention, a piezoelectric element is provided which can be manufactured more easily and accurately. The piezoelectric element of the invention comprises an element piece formed of a piezoelectric piece with an electrode formed on the surface thereof. A plug is also provided in which this element piece is mounted. A case for housing the element piece in an air-tight manner is also provided. The surface of the element piece is covered with a resin film which is formed with the use of an excited active species of an organic compound generated through a gas discharge in a prescribed discharge gas at approximately atmospheric pressure.

The resin film formed on the surface of the element piece by the use of a plasma through a gas discharge at approximately atmospheric pressure has such a high flexibility that formation of a relatively thick resin film does not impair the vibration of the element piece. It is therefore possible to largely improve the electric insulation of the element piece while maintaining the important operating properties of the piezoelectric element, and therefore, to effectively prevent deterioration of the electrodes or the like caused by gas release or mixing of oxygen with the electrodes. A wide tolerable range of film thickness of about ±1,000 Å can be set, and since any irregularities in the thickness of the film, if any, exert only very small effect on insulation and properties of the piezoelectric element as compared to the tolerable range, it is easy to control film thickness during manufacture to maintain the thickness within the desired range.

According to the invention, the foregoing resin film may be a polymerization film formed of an organic substance. When it is formed from a silicone resin, for example, repellency is available for the resultant resin film. A silicone resin film is therefore preferable. When the lower layer portion of the resin film is formed with an inorganic element or an oxide thereof contained in that organic compound, adherence is improved, and an excellent frequency property is obtained, even during aging of the element.

Such piezoelectric elements which may be formed in accordance with this invention include, but are not limited to, a tuning fork type resonator unit having, as an element piece, a piezoelectric resonator vibrating in the flexural or torsional vibration mode, a bar type AT-cut quartz crystal resonator unit having a quartz crystal resonator vibrating in a thickness shear mode, a SAW resonator unit using a surface acoustic wave, or a SAW device having a SAW piece such as a SAW filter. Particularly in the case of the tuning fork type resonator unit in which electrodes with different polarities are arranged adjacent to each other on the surface of the piezoelectric piece, in accordance with the invention a short circuit between the two electrodes can be prevented. It is therefore possible to set a narrower split line between electrodes, and thus to reduce the size of the product and to ensure better oscillation.

According to the invention, in the case of the tuning fork type piezoelectric resonator unit, a tuning fork shaped element piece is formed with two arms longitudinally extending from a base end of the piezoelectric resonator unit, which is in turn connected to the plug. The thickness of the resin film formed on the tuning fork shaped element piece is made thinner in the region adjacent the forked portion where the arms are longitudinally connected to the base end than in the other regions of the resonator. As a result, vibration of the piezoelectric resonator is not substantially inhibited by the resin film in the region adjacent the forked portion, where the amount of distortion of flexural vibration is at maximum, thus preventing any effect on the CI-value. A particularly preferable film thickness in this region adjacent the forked portion is about one half that in the other regions of the element piece, or more preferably, within a range of from 500 to 1,000 Å. Thus, a desired insulating effect is provided without affecting the operating properties of the piezoelectric resonator.

The method of manufacturing a piezoelectric element in accordance with the invention comprises the steps of forming an element piece of a piezoelectric piece within an electrode formed on the surface thereof, and mounting the element piece on a plug. Prior to sealing the element piece in a case in an air-tight manner, a gas discharge is produced in a predetermined discharge gas at approximately atmospheric pressure, generating an excited active species of an organic compound. The organic compound is preferably a liquid or a gas at room temperature. The surface of the element piece mounted on the plug is exposed to the excited active species and a resin film of the organic substance is formed on this surface.

Thus by producing a plasma through gas discharge at approximately atmospheric pressure, causing successive combination and dissociation of the thus produced excited active species of the organic substance and polymerizing the resin film directly from the gaseous phase, it is possible to form an insulating film having a thickness sufficient to cover the entire surface of the element piece and the plug exposed to the excited active species. It is therefore possible to completely insulate all portions of the electrodes, the split lines thereof, and the mount connecting portion of the plug. Because the resultant resin film is sufficiently flexible, there is no risk of impairing the ability of maintaining an air-tight seal between the case and the plug even when the resin film is formed on the sealing surface of the plug. It is therefore not required to mask the plug when the film is being formed, thus permitting easy formation and operation. Since vacuum equipment or other specialized facilities are not required, it is possible to easily configure the manufacturing apparatus at a low cost, to easily achieve an inline system and to easily automate the manufacturing process. In addition, as the resin film is formed with the element piece mounted on the plug, the frequency of the element can be measured during formation of the film. It is thus easy to accurately control and administer the film thickness to a value suitable for a desired frequency of the element.

According to the invention, the resin film may be formed by mixing an organic compound with the discharge gas. The organic compound to be mixed with the discharge gas may be silicone or a hydrocarbon compound.

According to the present invention, the surface of the element piece, which is mounted on the plug, is exposed to the excited active species of the discharge gas while the element piece travels upstream relative to the flow of the discharge gas supplied to the gas discharge region, i.e. from the downstream side to the upstream side of the flow of the discharge gas thereof. A hydrophilic film high in polymerization and adherence and low in the number of methyl groups is formed in the downstream portion of the discharge gas containing the excited active species. In the upstream portion thereof, in contrast, a repellent film low in polymerization and adherence and high in the number of methyl groups is formed. It is accordingly possible to control the properties of the resin film formed on the surface of the piezoelectric piece so that adherence is high in the lower layer portion, and repellency is high in the surface layer portion by moving the surface of the element in the upstream direction in the region of gas discharge during formation of the insulation film. It is therefore possible to form an insulating film which maintains a constant frequency even when subject to ageing, and which also inhibits gas release and adsorption. In an actual manufacturing line, it is preferable to supply the discharge gas while transferring the element piece mounted on the plug so that the element piece flows from the exit side toward the entrance side of the gas discharge region.

According to the invention, when the element piece is a tuning fork type piezoelectric resonator, frequency of the piezoelectric resonator can be adjusted by irradiating the resin film with a laser beam from above after forming the resin film. This irradiation allows simultaneous removal of the resin film and the metal film on the resonator surface. Thus, it is possible to accurately and easily adjust the frequency of the resonator. Also, the resin film is formed over the entire surface of the resonator without masking, thus permitting complete insulation of the resonator without impairing the operation thereof.

When the element piece is formed as a tuning fork type piezoelectric resonator, it is possible to manufacture a piezoelectric element in which the thickness of the resin film is smaller in the region adjacent the forked portion of the element than in the other regions of the element, as described above, by exposing the surface of the resonator to the excited active species for a shorter period of time in the region adjacent the forked portion than in the other regions of the element. Thus, it is possible to reduce the exposure time of the region adjacent the forked portion and easily adjust the thickness of the resin film through a process comprising the following steps. First, a gas discharge is produced by supplying the discharge gas to a discharge region and applying a prescribed voltage to the space between a pair of a source electrode and a grounding electrode oppositely arranged. Next, the piezoelectric resonator mounted on the plug is passed through the gas discharge region by causing the resonator to travel in the longitudinal direction thereof. The speed of travel when the region of the element adjacent the forked portion passes through the gas discharge region is higher than the speed when the other regions are passing through the gas discharge region. Thus, the thickness of the film formed in the region adjacent the forked portion of the element is thinner than the thickness of the film formed on other regions of the element.

It is therefore an object of the invention to provide a piezoelectric element which has an insulating film formed thereon which has a thickness sufficient to ensure a high electrical insulation on the surface of a piezoelectric piece having an electrode formed thereon and to inhibit the release and adsorption of gases and is flexible and adheres sufficiently to the piezoelectric element, but which does not impair the vibration of the element.

Another object of the invention is to provide a method of manufacturing a piezoelectric element which permits formation of an insulating film relatively easily in a short period of time at a low cost, allows easy control and administration of thickness and quality of the film to ensure satisfactory insulation and improves productivity through automation and achievement of an inline system.

An additional object of the present invention is to provide a manufacturing method which, particularly for a tuning fork type piezoelectric resonator unit, permits easy and accurate frequency adjustment.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, in which:

FIG. 15A is a longitudinal sectional view of a SAW device constructed in accordance with the invention; and FIG. 15B is an enlarged sectional view taken along the line 15B—15B of FIG. 15A.

DETAILED DESCRIPTION OF THE PREFERRED EMBODIMENTS

Figure 1:
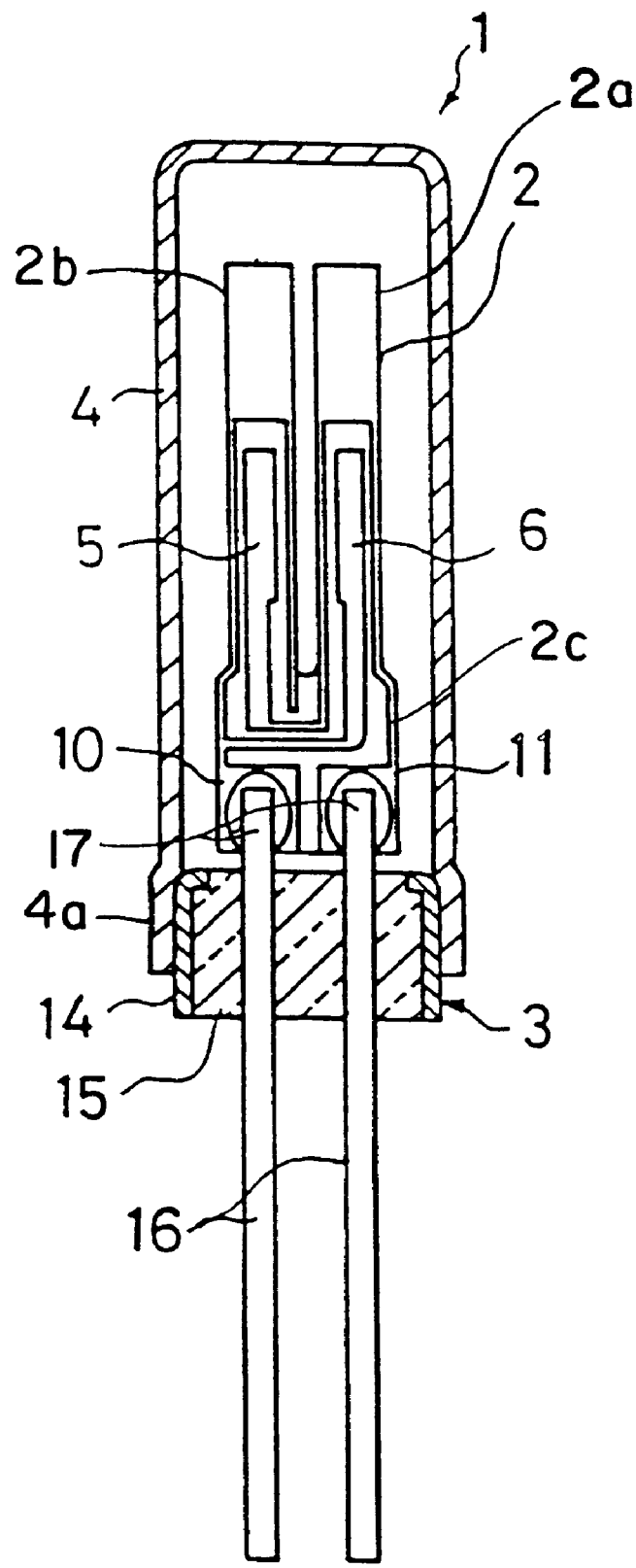
FIG. 1 is a cross-sectional view of a tuning fork type piezoelectric resonator unit constructed in accordance with the invention.
Figure 2:
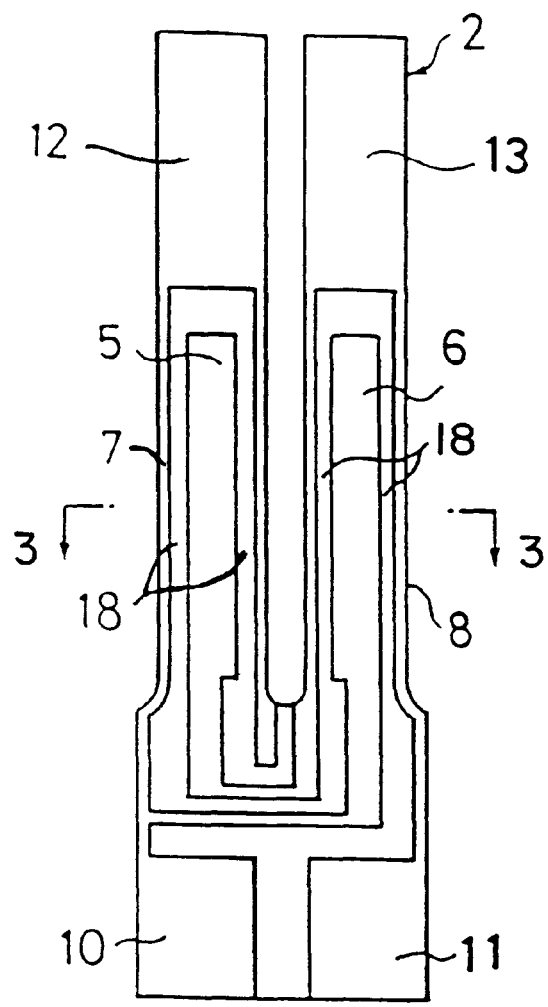
FIG. 2 is an enlarged plan view depicting the piezoelectric resonator constructed in accordance with the invention.
Figure 3:
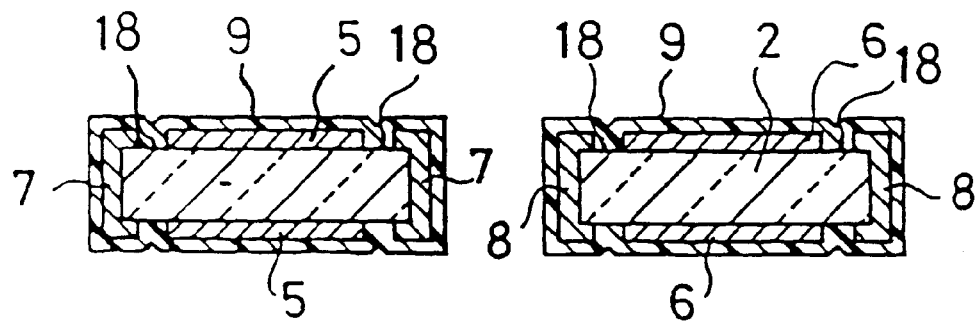
FIG. 3 is a cross-sectional view taken along the line 3—3 of FIG. 2.

FIG. 1 depicts a tuning fork type piezoelectric resonator unit 1 constructed in accordance with the invention. Piezoelectric resonator unit 1 includes an element piece, such as a piezoelectric resonator 2, a plug 3 for supporting piezoelectric resonator 2 in a cantilever manner, and a cylindrical metal case 4 having a bottom 4a. As is further shown in FIG. 2, piezoelectric resonator 2 comprises a thin quartz crystal piece formed into a desired tuning fork shape having right and left arms 2a, 2b extending longitudinally from a base end 2c. A pair of flat electrodes 5 and 6 are formed on opposed surfaces of resonator 2, a respective one of electrode 6 being formed on each surface of right arm 2a and one of electrode 5 being formed on each surface of left arm 2b. Side electrodes 7 and 8 extend in the thickness direction of resonator 2. As shown in FIG. 3, side electrodes 7 and 8 of this embodiment are formed so as to extend slightly around from the side of the individual quartz crystal pieces to the front and rear surfaces thereof. An electrically insulating resin film 9 is formed over substantially the entire surface of piezoelectric resonator 2. Piezoelectric resonator 2 is mounted on plug 3 and is then sealed in case 4 in an air-tight manner. The interior of the case 4 is preferably maintained in an evacuated manner.

Figure 4:
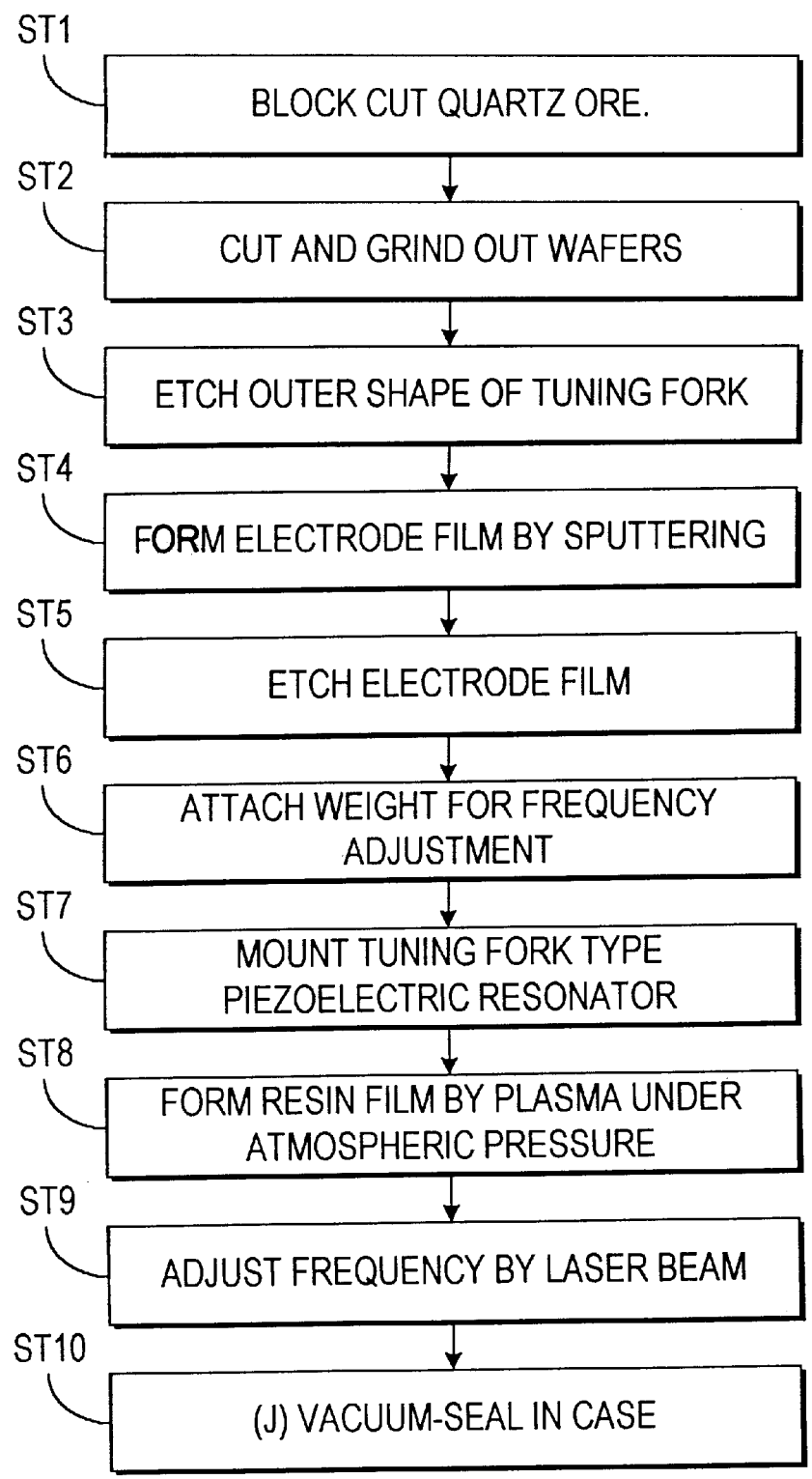
FIG. 4 is a flowchart illustrating the manufacturing process of a tuning fork type piezoelectric resonator in accordance with the invention.

Tuning fork type piezoelectric resonator unit 1 of this embodiment can be manufactured in accordance with the process shown in the flowchart of FIG. 4. First, as in the conventional process, in step ST1 a quartz ore is cut into blocks of prescribed size and shape, which are then cut and ground out into wafers of a prescribed thickness in step ST2. A corrosion resistant film comprising, for example, a Chromium (Cr) film and a Gold (Au) film is formed by sputtering or vapor deposition. A resist applied to the film is patterned into a tuning fork shape by the photomask technique. After removing the exposed corrosion resistant film, a plurality of tuning fork shapes are etched on the resultant quartz crystal wafers by the use of fluoric acid or the like in step ST3.

Then, in step ST4 the electrode is formed by conventional technique, for example, by forming a Chromium (Cr) primer layer having a thickness within a range of from 100 to 500 Å on the surface of the foregoing quartz crystal piece by vapor deposition or sputtering. A Gold (Au) electrode film having a thickness within a range of from 2,000 to 3,000 Å is then patterned thereon by photolithography in step ST5. In an alternative embodiment, the foregoing electrode can be formed by vapor deposition or by sputtering a Chromium (Cr) film and a Gold (Au) film after the quartz crystal piece surface has been masked.

The gap between the above-mentioned neighboring flat and side electrodes known as the split line has a width of from about 20 to 30 μm at the narrowest portion thereof to ensure efficient oscillation of a compact piezoelectric resonator. The foregoing electrode film may be formed of Silver (Ag). Right and left lands 10 and 11 are drawn out from electrodes 5 and 6 and are provided at the lower portion of base end 2c of piezoelectric resonator 2. In step ST6, overlap portions 12 and 13, for frequency adjustment, are provided at the tips of the arms of piezoelectric resonator 2. A Gold (Au) film having a thickness of from about 2 to 3 μm, which is greater than the thickness of the other electrode portions, is formed on each of overlap portions 12 and 13.

Then, each individual piezoelectric resonator 2 is cut from the foregoing quartz crystal wafers, and is mounted on a plug 3 in step ST7. Plug 3 is a part conventionally known as a hermetic terminal, and is formed with two leads 16 passing through an insulator 15 comprising glass fitted with a metal ring 14 on the outer periphery thereof (FIG. 1). Short pin-shaped inner lead terminals 17 project from insulator 15 of plug 3 toward the interior of case 4 and are connected to individual lands 10 and 11 of piezoelectric resonator 2 by brazing using solder, or adhesion using Silver (Ag) paste. Consequently, plug 3 supports piezoelectric resonator 2 in a cantilever manner. At the same time, electrodes 5 and 6 can be electrically connected to external electric circuits via leads 16.

When piezoelectric resonator 2 is mounted on plug 3 in step ST7, a resin film 9 is formed on piezoelectric resonator 2 by the exposure of the surface of piezoelectric resonator 2 to a plasma produced by discharge at approximately atmospheric pressure in step ST8, as described later with reference to FIG. 5. Resin film 9 of this embodiment comprises a silicone resin film, and is formed so as to completely cover not only flat electrodes 5 and 6 and side electrodes 7 and 8, but also the quartz crystal surface exposed to split line 18, lands 10 and 11, inner lead terminals 17 and the connections thereof.

As a result, it is possible, in piezoelectric resonator 2, to prevent a short circuit between the adjacent electrodes caused by dust produced during the manufacturing process or from plug 3 or case 4. The absorption of gases released from plug 3, case 4, or the Silver (Ag) paste into the electrode film is also prevented. In addition, because resin film 9 is flexible, forming this film 9 with a large thickness sufficient to attain electric insulation brings about no risk of substantially impairing vibration of the piezoelectric resonator during use. In alternative embodiments, apart from silicone, any number of various resin materials may be used for resin film 9, including, but not limited to, organic compounds such as hydrocarbon compounds.

Figure 5:
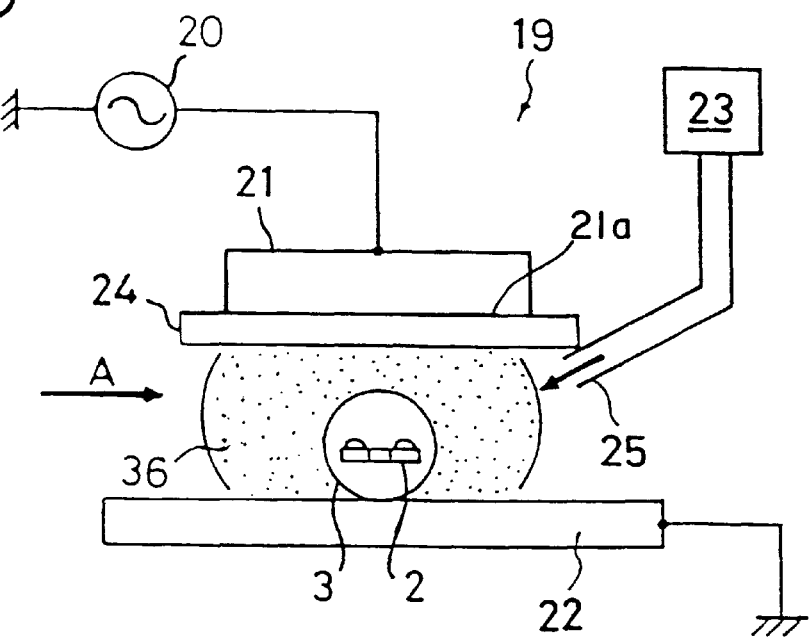
FIG. 5 is a schematic diagram of a surface treatment apparatus for forming a resin film on the surface of a piezoelectric resonator unit using plasma produced at atmospheric pressure in accordance with the invention.

Resin film 9 is generally formed with the use of a surface treatment apparatus of which the construction is shown in FIG. 5. A surface treatment apparatus 19 comprises a flat source electrode 21 connected to an AC power source 20. A stage 22, which also acts as a grounding electrode, is positioned opposite flat source electrode 21 with a narrow gap, defining a discharge region 36, being provided therebetween. A gas supply apparatus 23 for supplying a discharge gas to discharge region 36 is also provided. A lower surface 21a of source electrode 21 is coated with a dielectric 24, such as a quartz sheet, to eliminate unwanted or abnormal discharge. Gas supply apparatus 23 is further formed with a nozzle 25. The opening of nozzle 25 is positioned so as to eject the discharge gas into the space formed between dielectric 24 and the stage 22, discharge region 36.

The atmosphere in the space formed between dielectric 24 and stage 22 is substituted with the discharge gas by ejecting the discharge gas from the nozzle 25. In accordance with the invention, piezoelectric resonator 2 mounted on plug 3 is transferred continuously in the direction indicated by arrow A in FIG. 5. For example, a conveyor is provided (not shown) which supports plug 3 and resonator 2, and travels between dielectric 24 and stage 22 from the distal side of stage 22 from nozzle 25 horizontally toward nozzle 25, or the direction indicated by arrow A. Piezoelectric resonator 2 is therefore transferred from the distal (downstream) side of discharge region 26 to the proximate (upstream) side thereof relative to the flow of the discharge gas. A mixed gas containing gaseous silicone may be used as the discharge gas, and may be mixed with a rare gas such as helium, which acts as the carrier gas, so as to facilitate production of a gas discharge at approximately atmospheric pressure in the space formed between dielectric 24 and stage 22, discharge region 36. Silicone can easily be mixed into the discharge gas by heating a silicone material which is a liquid at room temperature, to an appropriate temperature so that the silicone evaporates.

Figure 6:
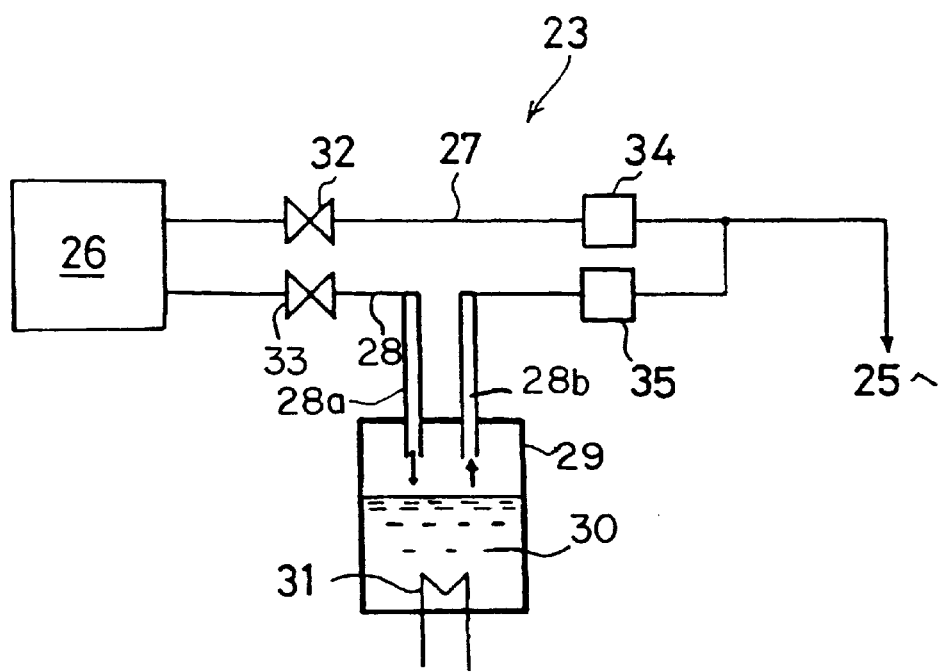
FIG. 6 is a schematic diagram of an embodiment of a gas supply apparatus for supplying a discharge gas containing gaseous silicone in accordance with the invention.

The discharge gas containing gaseous silicone mixed therewith may be easily produced by using a gas supply apparatus 23 having the construction as shown in FIG. 6, for example. A duct 27 is provided which places a gas source 26 in fluid communication with nozzle 25. A bypass 28 is provided in duct 27 to feed part of the carrier gas, such as helium, supplied from gas source 26 into a tank 29 through a bypass duct 28a. Silicone 30, which is a liquid at room temperature, is stored in tank 29, and is evaporated by means of a heater 31. The carrier gas introduced into the tank 29 is returned to duct 27 via a return duct 28b, while containing gaseous silicone. The ratio of silicone contained in the discharge gas supplied to the surface treatment apparatus is appropriately adjusted by controlling the flow rate of the carrier gas sent from gas source 26 through control valves 32 and 33 to duct 27 and bypass 28 by means of flow controllers 34 and 35 respectively, which operate control values 32 and 33 in a feedback control manner.

Figure 7:
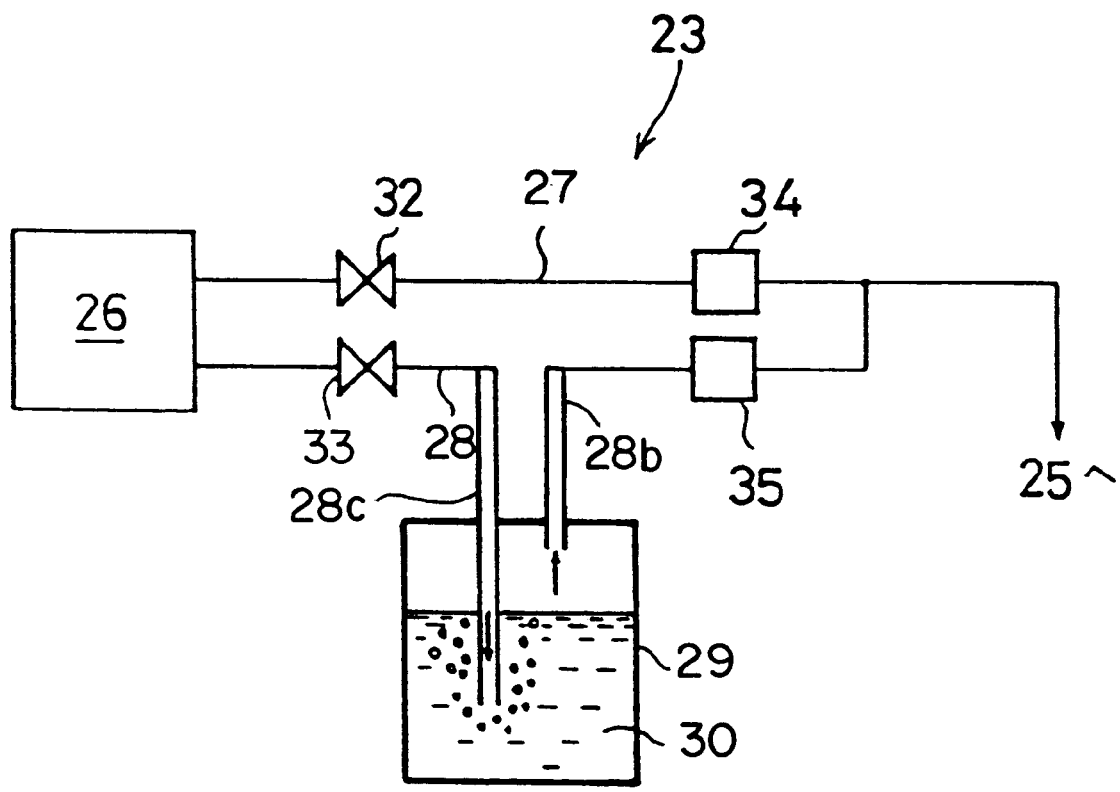
FIG. 7 is a schematic diagram of another embodiment of a gas supply apparatus constructed in accordance with the invention.

FIG. 7 illustrates an additional embodiment of the gas supply apparatus for supplying a discharge gas containing gaseous silicone mixed therewith to the surface treatment apparatus, like elements being designated by like reference numerals. In this embodiment, heater 31 shown in FIG. 6 is omitted from tank 29. In its place, the carrier gas introduced from the gas source 26 is ejected into liquid silicone 30 in the tank 29 via a duct 28c. As a result, the carrier gas containing the gaseous silicone is generated in the upper space in tank 29. This gas is returned to duct 27 via return duct 28b as in the above embodiment. Thus, it is possible to supply the carrier gas containing silicone from nozzle 25 to the surface treatment apparatus.

Referring once again to FIG. 5, at the same time that the discharge gas is ejected from nozzle 25, a prescribed voltage is applied from AC power source 20 onto source electrode 21 to produce a gas discharge at approximately atmospheric pressure between source electrode 21 and stage 22 (FIG. 6), discharge region 36. In this discharge region 36, a plasma is generated by gas discharge, causing reactions of the discharge gas such as dissociation, ionization and excitation, and thus an active species of silicone is generated. Through successive combination and dissociation of the silicone active species, silicone resin is polymerized directly from the gas phase onto the surface of piezoelectric resonator 2 passing through discharge region 36, and resin film 9 (as shown in FIG. 3) is easily formed in a relatively short period of time. The thickness and forming speed of resin film 9 are controlled by adjusting such discharge conditions as the amount of silicone to be mixed with the discharge gas, the exposure time to the gas discharge, and the voltage to be applied.

In an additional embodiment of the invention, an organic compound other than silicone, which is a liquid or a gas at room temperature, including, but not limited to, an organic substance such as a hydrocarbon compound may be used as the discharge gas. Thus, a resin polymerization film corresponding to the material used is formed on the surface of piezoelectric resonator 2. When using silicone or an organic compound which is a liquid at room temperature, this silicone or organic compound may be mixed with the carrier gas by evaporating by heating or by passing the gas through the liquid as described above in the embodiments shown in FIGS. 6 and 7. When the silicone or organic compound is a gas at room temperature, the compound may be mixed directly with the carrier gas.

In addition to helium as described above, any rare gas such as argon, nitrogen and $CF_4$, but not limited thereto, may be used as the carrier gas. Particularly when using nitrogen, hydrocarbon fluoride, or $CF_4$ or any gas containing a fluorocarbon, the forming speed of the resin film can be increased.

In a film forming technique using a plasma produced at approximately atmospheric pressure, in discharge region 36 as shown in FIG. 5, a film of an organic substance formed in the area proximate nozzle 25 is formed with a low degree of polymerization and adherence, a high degree of repellency, and contains many methyl groups. However, a film of an organic substance formed in the distal end of stage 22, far from nozzle 25, tends to be high in polymerization and adherence, to be hydrophilic and contain a smaller number of methyl groups. As shown in FIG. 5, therefore, it is possible to change the film properties of resin film 9 formed on the surface of piezoelectric resonator 2, from the lower layer portion having a high adherence toward the upper layer portion of a desired organic polymerization film, by transferring piezoelectric resonator 2 from the distal side of discharge region 36 apart from nozzle 25 toward the proximate side of discharge region 36 adjacent nozzle 25 thereto. It is also possible to improve productivity by continuously transferring a plurality of piezoelectric resonators 2 on the conveyor means and sequentially carrying out a film forming treatment.

Figure 8:
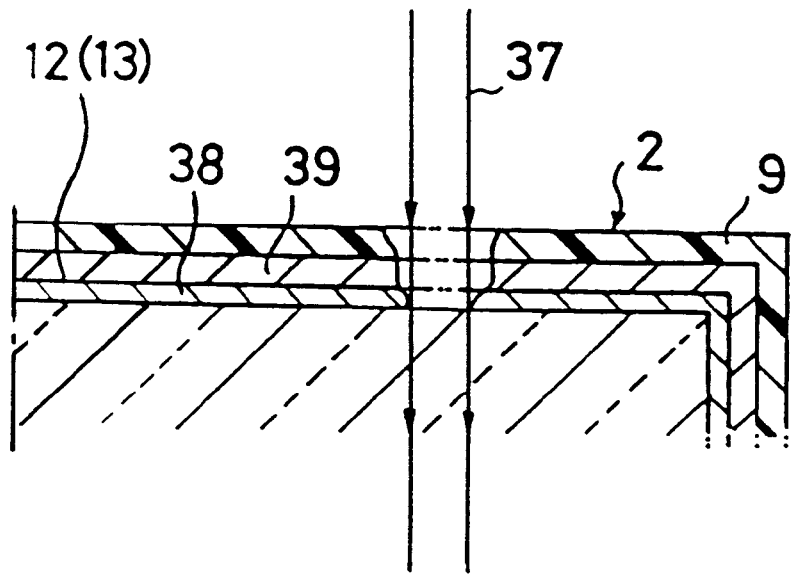
FIG. 8 is an enlarged cross-sectional view of the tip of the arm of a piezoelectric resonator constructed in accordance with the invention illustrating the overlap portion therefore being frequency-adjusted by a laser beam.

For piezoelectric resonator 2 thus covered with the resin film 9 over the entire surface thereof, frequency adjustment is accomplished by grinding the overlap portions 12 and 13 to the tips of the arms thereof by means of a laser, as shown in ST9 of FIG. 4. In FIG. 8, as is shown in the conventional art, a laser beam 37 having an output of about 20 W irradiates resin film 9 from above in the form of a spot having a diameter of from 20 to 40 $\mu$m. Resin film 9, which is formed of an organic material, is removed through sublimation, together with the electrode film comprising the Chromium (Cr) primer layer 38 and the Gold (Au) film 39 composing the overlap portions 12 and 13, by means of laser beam 37. According to this embodiment of the invention, it is not necessary to provide an insulating film by masking overlap portions 12 and 13 as in the conventional art as described above. Thus, the resin film is formed and frequency is adjusted after mounting the resonator onto plug 3. It is therefore possible to obtain satisfactory operation, improve productivity and obtain a more complete insulating effect while insuring a proper operating frequency.

Then, before attaching case 4 to resonator 2, gases and water which may be released over time from the surface of resonator 2 are forcedly evacuated by a degassing treatment by heating piezoelectric resonator 2 and plug in vacuum. By pressure-inserting a metal ring 14 of plug 3 into an opening of case 4 in a vacuum or in a nitrogen atmosphere as shown in step ST 10 of FIG. 4, piezoelectric resonator 2 is sealed in case 4, thereby completing the manufacture of tuning fork type piezoelectric resonator unit 1 shown in FIG. 1. The surface of metal ring 14 and the inner surface of case 4 are soldered prior to insertion. Thus, the solder filling the gap between the metal ring and the case ensures an air-tight seal between the case and metal ring upon pressure-insertion of plug 3.

When forming resin film 9 in this embodiment, no masking is applied to plug 3. Piezoelectric resonator 2 is mounted to plug 3 as in the conventional art. The entire surface of piezoelectric resonator 2 and the plug 3 are exposed to the gas discharge. As a result, resin film 9 is formed also on unnecessary portions of piezoelectric resonator 2, other than the electrodes 5 to 8 and split line 18 as well. However, for example, resin film 9 formed on the surface of metal ring 14 is easily removed upon pressure-inserting plug 3. Because any remaining portion of resin film 9 is flexible, there is no risk of the impairment of the formation of an air-tight seal between plug 3 and metal ring 14.

Figure 9:
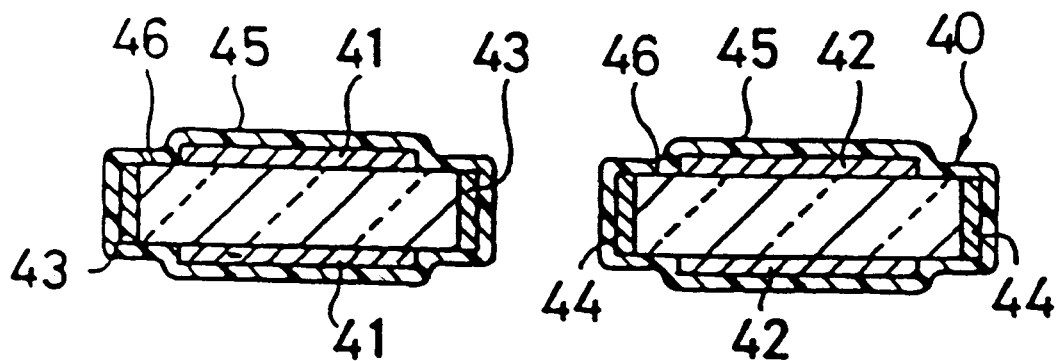
FIG. 9 is a cross-sectional view of the electrode-shaped piezoelectric resonator constructed in accordance with another embodiment of the invention.

FIG. 9 illustrates a variation of the piezoelectric resonator 2 having electrodes of a shape different from that in the above embodiment, like structure being designated by like reference numerals. In piezoelectric resonator 40, while flat electrodes 41 and 42 have a shape similar to electrodes 5 and 6 shown in FIG. 3, side electrodes 43 and 44 are formed only on sides of the quartz crystal sheet. A resin film 45 is formed by the above-mentioned film forming technique described with reference to FIG. 5 so as to completely cover the surfaces of electrodes 41, 42, 43 and 44 and a split line 46 over the entire surface of piezoelectric resonator 40.

Figure 10C:
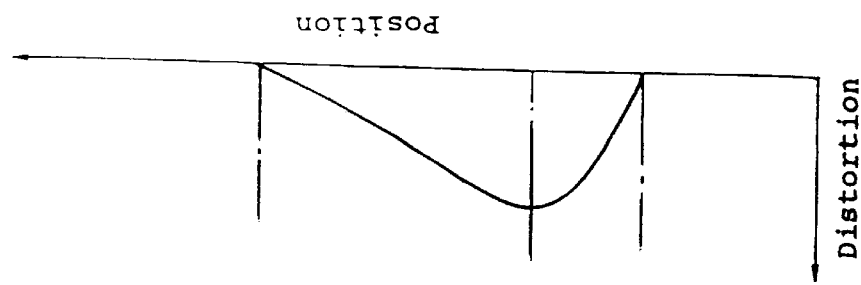
FIG. 10C is a graph depicting the amount of distortion of a piezoelectric resonator constructed in accordance with the invention at various points thereof.
Figure 10B:
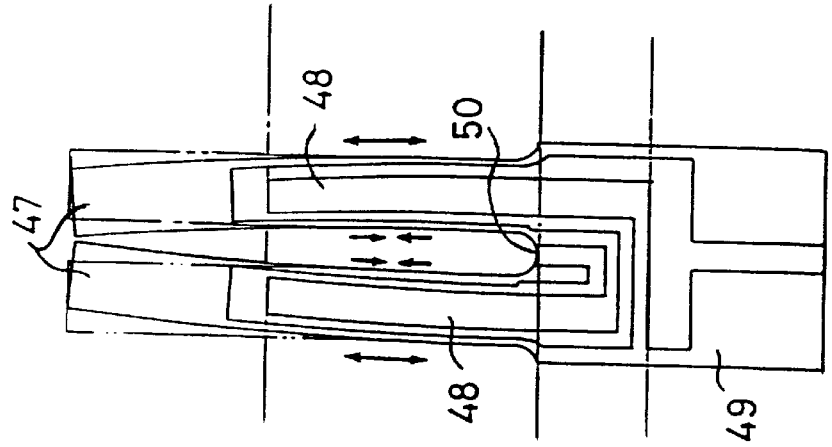
FIGS. 10A and 10B are plan views illustrating flexural vibration of a tuning fork type piezoelectric resonator constructed in accordance with the invention.
Figure 10A:
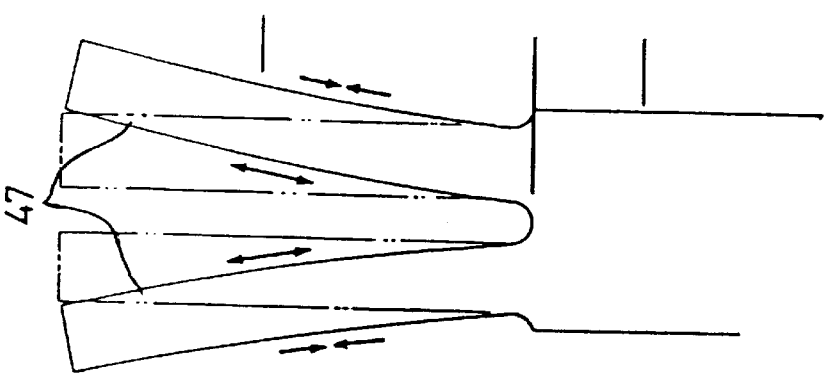

As is further shown in FIGS. 10A, 10B and 10C, as is well known in general, in a tuning fork type piezoelectric resonator unit, the inside and the outside of each of arms 47 alternately expand and contract, thus flexurally vibrating as shown in FIGS. 10A and 10B. The range of this vibration is substantially limited within the region of excitation electrode 48. Thus, the amount of distortion reaches a maximum in the proximity of forked portion 50 where arms 47 are connected to base end 49 as shown in FIG. 10C. In an alternative, preferred embodiment of the present invention shown in FIG. 11, resin film 53 is formed with a smaller thickness in the region adjacent forked portion 52 in the longitudinal direction of piezoelectric resonator 51 than in the other regions of piezoelectric resonators 51. As a result, flexural vibration of the piezoelectric resonator is not inhibited by resin film 53, thus permitting maintenance of a satisfactory CI-value.

The thickness of resin film 53 in the region adjacent forked portion 52 is preferably about half the film thickness in the other regions. In order not to inhibit vibration and to also ensure the minimum necessary insulation of the resin film, the film thickness in the region near the forked portion should preferably be within a range of from about 500 to 1,000 Å. In this case, the film thickness in the other regions should be within a range of from about 1,000 to 2,000 Å. According to experiments conducted by the inventors of the invention, resin films formed by the invention gave similar values of insulation although slight differences were observed in flexibility between different materials.

Figure 12A:
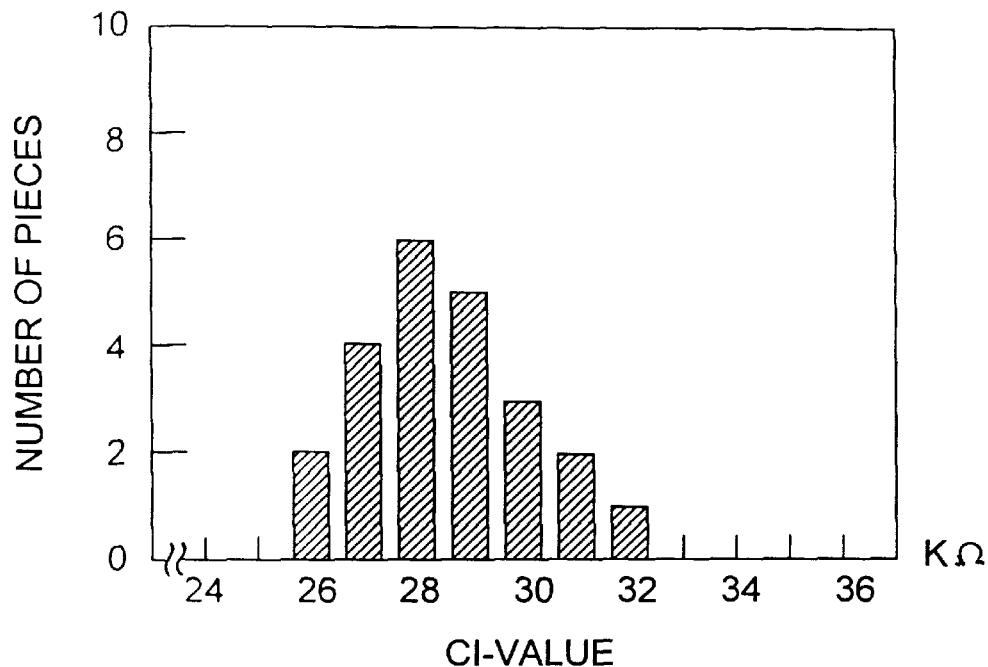
FIG. 12A is a bar graph illustrating CI-values measured for a tuning fork type piezoelectric resonator constructed in accordance with the invention.

The results of the measurement of CI-value for a tuning fork type piezoelectric resonator unit manufactured in accordance with this embodiment are shown in FIG. 12A. The tuning fork type piezoelectric resonator unit used in this test had a frequency of 32 kHz and a size of $\phi$2×6 mm. 28 such samples were manufactured with a resin film thickness adjacent the formed portion of 500 Å and a thickness of 2,000 Å for the other regions. The result of measurement of CI-value of these samples is shown in FIG. 12A. As an example for comparison, 28 sample piezoelectric resonators were manufactured by uniformly forming resin films to a thickness of 2,000 Å over the entire surface thereof for the same tuning fork type piezoelectric resonator unit. The result of measurement of CI-value for the samples for comparison is shown in FIG. 12B.

Figure 12B:
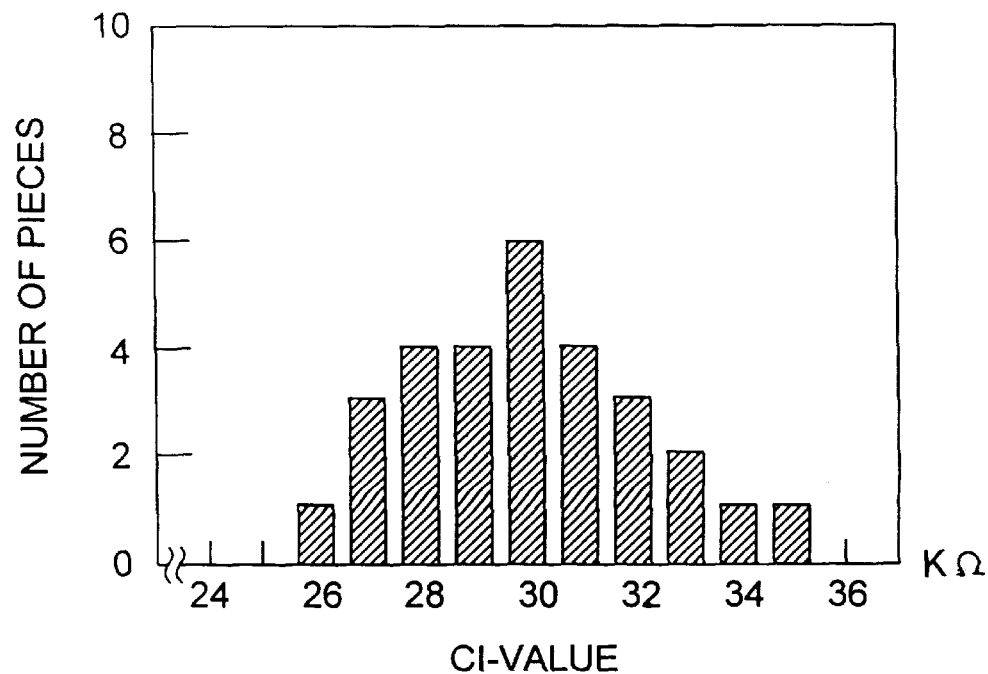
FIG. 12B is an example bar graph illustrating CI-values for a standard tuning form type piezoelectric resonator for comparison purposes.

As is clear from comparison of FIGS. 12A and 12B, the CI-value of the piezoelectric resonator unit of the invention has a peak at 28 kΩ with slight variations, whereas the example for comparison has a peak at 30 kΩ, higher by 2 kΩ with considerable variation. In practice, while piezoelectric resonator units in the art have been downsized in response to the requirement for more compact electronic parts, the CI-value has increased slightly along with downsizing. A further increase in CI-value as a result of the surface treatment for forming an insulating film is not desirable. Thus, according to this embodiment of the invention, it is possible to achieve a more compact tuning fork type piezoelectric resonator unit while maintaining a satisfactory CI-value.

Figure 11:
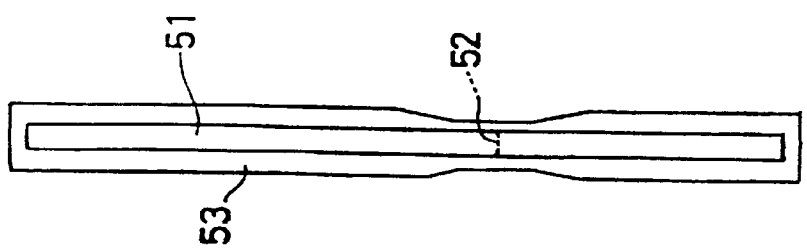
FIG. 11 is a side elevational view of a tuning fork type piezoelectric resonator constructed in accordance with another embodiment of the invention.
Figure 13:
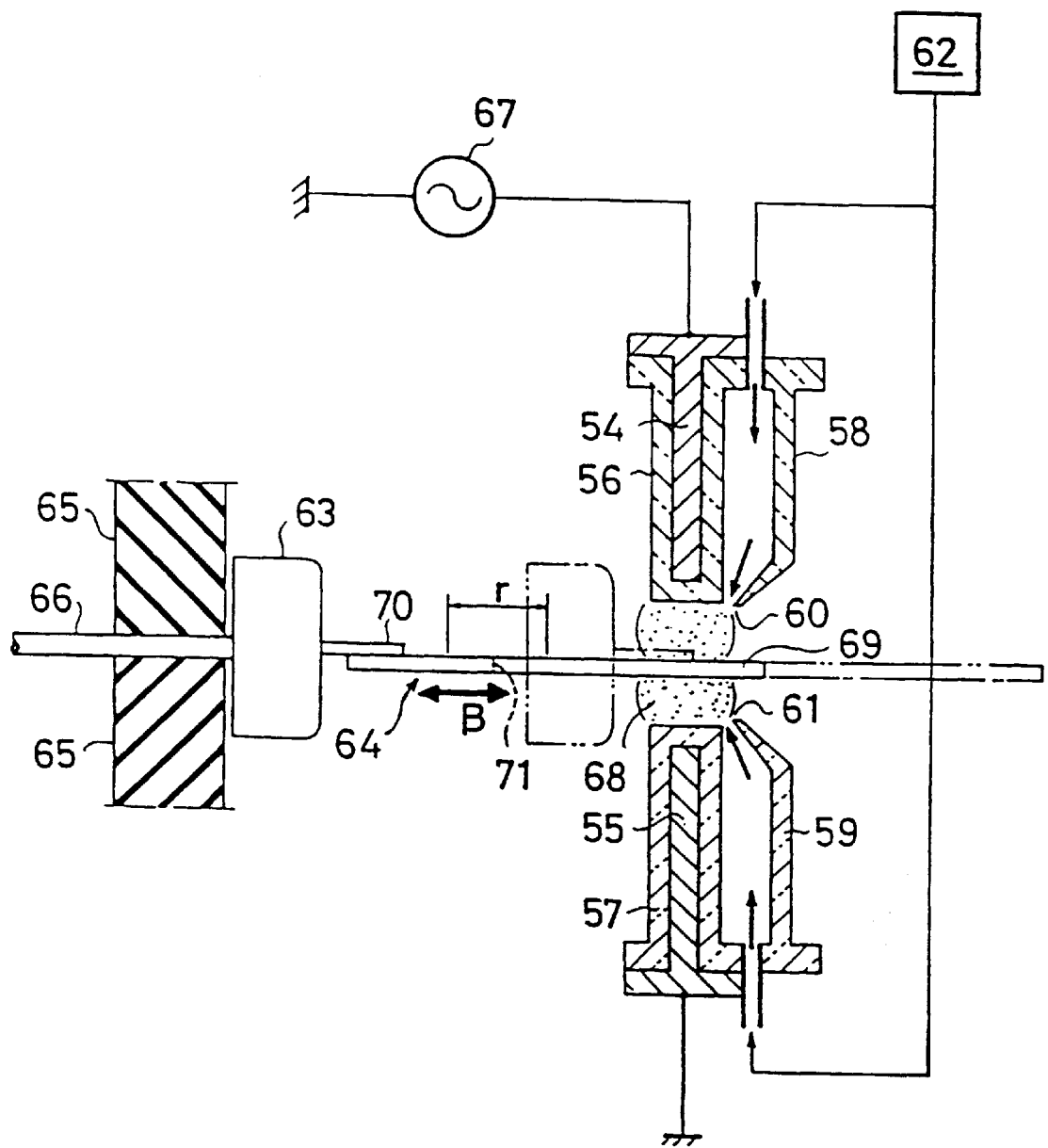
FIG. 13 depicts the construction of the surface treatment apparatus for forming a resin film constructed in accordance with the invention.

For the tuning fork type piezoelectric resonator unit shown in FIG. 11, resin films can be formed simultaneously on the both surfaces of the resonator by using the surface treatment apparatus shown in FIG. 13. This surface treatment apparatus is known as a line type and performs linear surface treatment. A pair of vertically opposed electrodes comprising a source electrode 54 and a grounding electrode 55 are provided. Each of these electrodes is a vertically arranged flat sheet, having a construction in which the outer surface thereof is covered with dielectric 56 or 57 such as glass or alumina. These electrodes are arranged symmetrically in the vertical direction. Nozzles 60 and 61 are formed by walls 58 and 59, which are formed of an insulating material, on a side of electrodes 54 and 55. Nozzles 60 and 61 open toward a narrow gap delimited between electrodes 54 and 55, and are connected to a common discharge gas source 62.

A tuning fork shaped piezoelectric resonator 64 is mounted on a plug 63 and is held so that the both surfaces thereof are positioned horizontally by holding an outer lead 66 from above and below by an appropriate holder 65 formed of an insulating material. Holder 65 can cause piezoelectric resonator 64 to travel forward and backward in the longitudinal direction (in the direction of double headed arrow B in FIG. 13) while adjusting the speed of travel.

In the same manner as in the surface treatment apparatus shown in FIG. 5, a gas discharge is produced at approximately atmospheric pressure between electrodes 54 and 55 by applying a prescribed voltage from an AC power source 67 onto source electrode 54 while supplying a gas mixed with gaseous silicone from a gas source 62 and ejecting the gas from nozzles 60 and 61 to the gap between electrodes 54 and 55. A discharge region 68 is linearly formed in the vertical direction in the drawing, in which an excited active species of silicone is generated as in the previous embodiment.

Tuning fork type piezoelectric resonator 64 is caused to travel by the holder 65 horizontally in the longitudinal direction and in a direction at right angles to the foregoing linear discharge region, as is shown by double-headed Arrow B in FIG. 13. Both surfaces of piezoelectric resonator 64 are exposed little by little in the longitudinal direction from the tip of an arm 69 to a base end 70, and linearly in the transverse direction to discharge region 68. The silicone resin is polymerized directly from a gas phase, and resin films are simultaneously formed on either side of resonator 64. Piezoelectric resonator 64 travels at a low constant speed from the tip of arm 69 to a position proximate the forked portion 71, at a high speed in the region adjacent forked portion 71, and at a low constant speed again after the region adjacent forked portion 71 has been removed from discharge region 68. As a result, it is possible to reduce the exposure time of the region near the forked portion to the discharge region, and extend the exposure time in the other regions. Thus, it is possible to form a resin film on piezoelectric resonator 64 with a film thickness distribution as shown in FIG. 11.

Holder 65 can preferably hold any number of piezoelectric resonator units 64, which permits simultaneous treatment by causing each piezoelectric resonator 64 to pass through linear discharge region 68. The traveling speed of each piezoelectric resonator 64 may be set appropriately in response to the discharge conditions such as electrode size, applied voltage and the required film thickness. In this embodiment, piezoelectric resonator 64 may be treated when being moved in a direction along its length, i.e. by moving resonator 64 from the arm tip toward the base end and back to the arm tip, into discharge region 68. In an alternative embodiment, it is also possible to fix the position of the piezoelectric resonator 64 and perform surface treatment while causing electrodes 64 and 65 to travel. It is also of course possible to treat one surface of piezoelectric resonator 64 at a time.

Figure 14A:
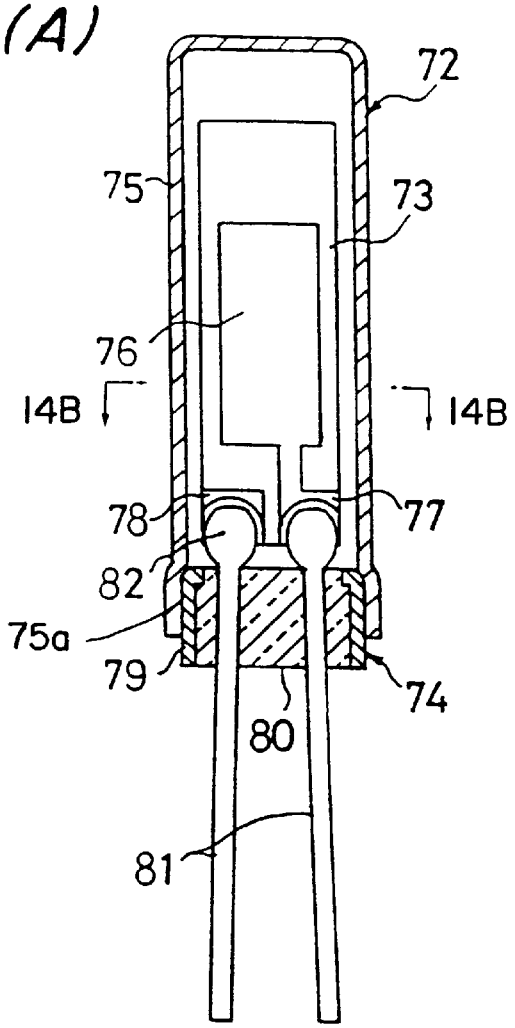
FIG. 14A is a cross-sectional view of a bar type AT-cut quartz crystal resonator unit constructed in accordance with the invention.

The present invention is applicable, not only to the foregoing tuning fork type piezoelectric resonator unit, but also to piezoelectric elements of other types, such as a bar type AT-cut quartz crystal resonator unit and an SAW device in the same manner as above. FIG. 14A illustrates an embodiment of a bar type AT-cut quartz crystal resonator unit constructed in accordance with the invention. Quartz crystal resonator unit 72 is formed with a quartz crystal resonator 73, a plug 74 supporting resonator 73, and a cylindrical metal case 75 with a bottom 75a. In quartz crystal resonator 73, rectangular excitation electrodes 76 of the same pattern are formed on each of the surfaces of a thin rectangular quartz crystal plate by forming a Chromium (Cr) under-layer and a Silver (Ag) or Gold (Au) thin film thereon by vapor deposition or sputtering. Connecting lands 77 and 78 are drawn out from electrodes 76 and are provided on the lower end thereof.

Plug 74 is a hermetic terminal having two leads 81 passing through a glass insulator 80. A metal ring 79 is fitted around the outer periphery of glass insulator 80. Glass insulator 80 holds quartz crystal resonator 73 in a cantilever manner by soldering inner lead terminals 82 projecting into case 75 to lands 77 and 78. Quartz crystal resonator 73 is housed in case 75 in an air-tight manner. A vacuum or nitrogen atmosphere is maintained in case 75 by pressure-inserting metal ring 79 of plug 74 into an opening of case 75.

Figure 14B:
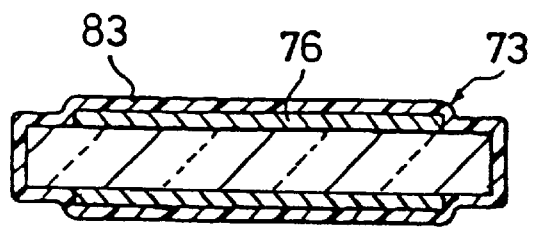
FIG. 14B is a cross-sectional view taken along line 14B—14B of FIG. 14A.

As is shown in FIG. 14B, a resin film 83 is formed over the entire surface of quartz crystal resonator 73. Resin film 83 can be formed by the use of surface treatment apparatus 19, as shown in FIG. 5, in a manner similar to the formation of the tuning fork type piezoelectric resonator unit shown in FIG. 1. An excited active species of an organic compound is generated by using a discharge gas formed by mixing an organic compound such as silicone with a carrier gas such as helium, and producing a gas discharge at approximately atmospheric pressure. Quartz crystal resonator 73 is mounted on plug 74 and is exposed to the thus generated excited active species, thereby forming a polymerization film covering the entire surface thereof. With this resin film, it is possible to eliminate the risk of short circuit between adjacent lands 77 and 78. Also deterioration of the operating properties of the resonator, such as a shift of oscillation frequency or an increase in CI-value resulting from adsorption of gases by excitation electrode 76 of the quartz crystal resonator released from plug 74 or case 75 can be avoided. In addition, because resin film 83 is flexible, vibration of quartz crystal resonator 73 is not impaired. Thus, there is no risk of impairing the operating properties of the quartz crystal resonator unit. When pressure-inserting plug 74 into the case 75, the formation of an air-tight seal is not impaired by the resin film formed on the surface of metal ring 79 of the plug 74.

FIG. 15A illustrates an additional embodiment of the invention, comprising substituting a SAW device as the element piece and constructed in accordance with the invention. A SAW device 84 has substantially the same construction as the foregoing piezoelectric resonator unit. In SAW device 84, a SAW resonator 85 is mounted in a cantilever manner on a hermetic terminal, plug 86. SAW device 84 is further housed in a cylindrical metal case 87 in an air-tight manner. In the SAW resonator 85, an interdigital transducer (IDT) formed by combining a set of comb-shaped electrodes 88 and 89 is formed at substantially the center of the main surface of a rectangular quartz crystal plate. A grating-shaped reflector 90 is provided on each of the longitudinal sides of the IDT. The lower end of SAW resonator 85 is provided with right and left lands 91 and 92 drawn out from comb-shaped electrodes 88 and 89 for connecting SAW resonator 85 to an external electronic circuit. These electrodes, reflectors and lands are constructed by forming an Aluminum (Al) thin film, through vapor deposition or sputtering, on the surface of the quartz crystal plate, and patterning this film by the use of the photolithography technique. A conductive material such as Gold (Au) or an Aluminum-Copper (Al—Cu) alloy may be used as a material for the electrodes, apart from Aluminum (Al). As a substrate for SAW resonator 85, a piezoelectric material such as lithium tantalate or lithium niobate may be used apart from quartz crystal.

As in the case of the piezoelectric resonator units shown in FIGS. 1 and 14, in plug 86, inner lead terminals 95 of leads 94 pass through a glass insulator 93 and are soldered to respective lands 91 and 92 of SAW resonator 85. SAW resonator 85 is vacuum-sealed by pressure-inserting a metal ring 96 fitted around insulator 93 into an opening of case 87. In SAW device 84 of the embodiment, a sufficient space between SAW resonator 85 and case 87 is ensured by supporting SAW resonator 85 in a cantilever manner from plug 86 so as to float from case 87. It is therefore possible to prevent unstable oscillation caused by contact of these components, occurrence of dust in case 87, to reduce the adverse effect such as deformation of SAW resonator 85 caused by external stress and the resultant change in frequency, and thus to obtain a very stable resonance frequency and a satisfactory ageing property. Case 87 may be any of a number of various shapes such as oval cylindrical, round and box shapes, apart from a cylinder, and may be formed of a ceramic material.

As shown in FIG. 15B, a resin film 97 is formed over the entire surface of SAW resonator 85. Resin film 97 can be formed by the use of the surface treatment apparatus 19 shown in FIG. 5 as in the case of the piezoelectric resonator units shown in FIGS. 1 and 14. An excited active species of an organic compound is generated by using a discharge gas formed by mixing an organic compound with a carrier gas such as helium. A gas discharge at approximately atmospheric pressure is produced. SAW resonator 85 is mounted on plug 86, and the entire surface thereof is exposed to the thus generated excited active species. A polymerization film is formed covering the entire surface of SAW resonator 85. Since, in SAW resonator 85, this resin film completely covers not only the electrodes and the reflector, but also the exposed surface of the quartz crystal, it is possible to prevent a short circuit between the adjacent electrodes, between the electrode and the reflector or between adjacent lands caused by dust produced from the manufacturing process. Short circuit between the plug or the case can also be prevented. Finally, adsorption by the metal films of the electrodes of gases released by the plug, the case or an adhesive can also be prevented. Further, because resin film 97 is flexible, even formation of the film into a thickness sufficient to attain electrical insulation does not substantially impair performance of SAW resonator 85 during use. Under the effect of resin film 97 formed on the surface of metal ring 96 of plug 86, the formation of an air-tight seal between case 87 and plug 86 is not impaired.

According to the piezoelectric element of the present invention in which the element piece has a flexible resin film covering the entire surface thereof, vibration is not impaired even by the use of a film having a large thickness. Thus, it is possible to largely improve electrical insulation and prevent deterioration of the electrodes caused by gas release and adsorption or mixing of oxygen, while maintaining the operating properties of the piezoelectric element. Particularly in the case of a tuning fork type piezoelectric resonator, the risk of the resin film's inhibiting vibration is eliminated by using a smaller thickness of the resin film in the forked portion where the arms of the tuning fork are branched in the longitudinal direction thereof than the thickness of the resin film in the other portions of the resonator, and a satisfactory CI-value is maintained. Thus, it is not necessary to change the shape of the resonator when downsizing, thus reducing power consumption during operation.

According to the method of manufacturing the piezoelectric element of the present invention, a resin film is formed on the surfaces of the element piece and the plug. This is achieved by causing polymerization of an organic substance directly from the gas phase by the use of an excited active species of the organic substance generated by a plasma produced at approximately atmospheric pressure. It is therefore possible to electrically insulate all portions of each of the electrodes, the split line thereof, and the mount connecting portion of the plug. As this resin film is flexible, formation thereof on the sealing surface of the plug does not impair the ability to form an air-tight seal between the case and the plug. Absence of the necessity of masking any part of the resonator when forming the resin film facilitates the film forming process. Because it is not necessary to provide vacuum equipment and other expensive facilities, a simple manufacturing apparatus is achievable at a low cost, permitting achievement of an inline system and automation. This makes it easy to improve productivity and reduce the cost of production.

As the frequency of the resonator can be measured simultaneously with formation of the resin film, it is possible to accurately control and administrator a proper film thickness suitable for a desired frequency, thus allowing improvement of the operational properties of the piezoelectric element. Particularly in the case of the tuning fork type piezoelectric resonator, even when the resin film is formed on the entire surface thereof, including the overlap portion provided for frequency adjustment, it is possible to easily conduct frequency adjustment by removing simultaneously the resin film and the metal film through irradiation of this portion of the resonator by a laser from above. It is thus possible to obtain simultaneously accurate adjustment of frequency and insulation of the resonator. Thus, a tuning fork type piezoelectric resonator unit can be produced having a high performance quality. Additionally, the productivity of manufacture can be improved.

It is furthermore possible to control the film thickness so that adherence is higher in the lower layer portion and repellency is higher in the surface layer portion thereof. By forming the resin film through exposure of the surface of the resonator to active species formed in a discharge gas while causing the element piece mounted on the plug to be treated to travel from the downstream side to the upstream side relative to the flow of the discharge gas supplied to the discharge region, an insulating film which is excellent in frequency ageing property and which effectively protects the electrodes by inhibiting gas release and absorption is achieved.

It will thus be seen that the objects set forth above, among those made apparent from the preceding description, are efficiently attained and, since certain changes may be made in carrying out the above method and in the constructions set forth without departing from the spirit and scope of the invention, it is intended that all mater contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A method of manufacturing a piezoelectric element, the piezoelectric element having an element piece, including a piezoelectric material having an electrode formed on the surface thereof, a plug for mounting said element piece, and a case for housing said element piece in an air-tight manner, which comprises the steps of:
    mounting said element piece on said plug;
    producing a gas discharge in a predetermined discharge gas at approximately atmospheric pressure;
    generating an excited active species of an organic compound which is a liquid or a gas at room temperature as a result of said gas discharge in a gas discharge region;
    exposing the surface of said element piece and said plug to said excited active species; and
    forming a resin film over said surface of said element piece and said plug, thereby coating at least a portion of the plug and said element piece with said resin film.

2. The method of manufacturing a piezoelectric element of claim 1, wherein said organic compound is mixed with said predetermined discharge gas.

3. The method of manufacturing a piezoelectric element of claim 1, wherein said organic compound is silicone or a hydrocarbon compound.

4. A method of manufacturing a piezoelectric element, the piezoelectric element having an element piece, including a piezoelectric material having an electrode formed on the surface thereof, a plug for mounting said element piece, and a case for housing said element piece in an air tight manner, which comprises the steps of:
    mounting said element piece on said plug;
    producing a gas discharge in a predetermined discharge gas at approximately atmospheric pressure;
    generating an excited active species of an organic compound which is a liquid or a gas at room temperature as a result of said gas discharge in a gas discharge region;
    exposing the surface of said element piece to said excited active species; and
    forming a resin film over said surface of said element piece, wherein said discharge gas region has an upstream portion to a downstream portion, and further comprising the step of exposing the surface of said element piece to said excited active species while said element piece mounted on said plug travels relative to the flow of said predetermined discharge gas supplied to the said gas discharge region from the downstream portion thereof toward the upstream portion thereof.

5. The method of manufacturing a piezoelectric element of claim 4, wherein said predetermined discharge gas is supplied so that said element piece enters said discharge region at said downstream portion and wherein said element piece leaves said gas discharge region at said upstream portion.

6. The method of manufacturing a piezoelectric element of claim 5, wherein said element piece mounted on said plug passes through said gas discharge region.

7. The method of manufacturing a piezoelectric element of claim 1, wherein said element piece is a piezoelectric resonator having a tuning fork shape.

8. A method of manufacturing a piezoelectric element, the piezoelectric element having an element piece, including a piezoelectric material having an electrode formed on the surface thereof, a plug for mounting said element piece, and a case for housing said element piece in an air tight manner, which comprises the steps of:
    mounting said element piece on said plug;
    producing a gas discharge in a predetermined discharge gas at approximately atmospheric pressure;
    generating an excited active species of an organic compound which is a liquid or a gas at room temperature as a result of said gas discharge in a gas discharge region;
    exposing the surface of said element piece to said excited active species; and
    forming a resin film covering said surface of said element piece, wherein said element piece is a piezoelectric resonator having a tuning fork shape and after forming said resin film, the frequency of said piezoelectric resonator is adjusted by irradiating said resin film from above by a laser beam.

9. A method of manufacturing a piezoelectric element having an element piece, including a piezoelectric material having an electrode formed on the surface thereof, a plug for mounting said element piece and a case for housing said element piece in an air tight manner, which comprises the steps of:
    mounting said element piece on said plug;
    producing a gas discharge in a predetermined discharge gas at approximately atmospheric pressure;
    generating an excited active species of an organic compound which is a liquid or a gas at room temperature as a result of said gas discharge in a gas discharge region;
    exposing the surface of said element piece to said excited active species; and
    forming a resin film covering said surface of said element piece wherein said element piece is a tuning fork type piezoelectric resonator having two arms longitudinally extending from a base end thereof forming a forked portion and connected to said plug, and further comprising the step of exposing the surface of said piezoelectric resonator to said excited active species in a region adjacent said forked portion where said arms are connected longitudinally to said base end for a shorter time than the time for exposing the surface of said piezoelectric resonator in any of the other regions of said piezoelectric resonator.

10. The method of manufacturing a piezoelectric element of claim 9, further comprising the steps of:
    producing said gas discharge by applying a prescribed voltage while supplying said discharge gas to the space between an opposed pair of a source electrode and a grounding electrode;
    causing said piezoelectric resonator mounted on said plug to pass through said gas discharge region by causing said piezoelectric resonator to travel longitudinally relative to said electrodes;
    passing said portion of said piezoelectric resonator adjacent said forked portion through said gas discharge region at a speed higher than the speed of passing the other portions of said piezoelectric resonator through said gas discharge region.

11. The method of manufacturing a piezoelectric element of claim 1, further comprising the step of sealing said piezoelectric element in a case.

12. The method of manufacturing a piezoelectric element of claim 11, wherein said piezoelectric element is element within said case in an air-tight manner.

13. The method of manufacturing a piezoelectric element of claim 1, wherein said element piece has at least two opposed surfaces, and further comprising the step of simultaneously exposing two opposed surfaces to excited active species of an organic compound.

* * * * *